(12) United States Patent
Lai et al.

(10) Patent No.: US 7,240,311 B2
(45) Date of Patent: *Jul. 3, 2007

(54) COMBINATIONAL EQUIVALENCE CHECKING METHODS AND SYSTEMS WITH INTERNAL DON'T CARES

(75) Inventors: Yung-Te Lai, Cupertino, CA (US);
Chioumin Chang, San Jose, CA (US);
Kung-Chien Chen, Fremont, CA (US);
Chih-Chang Lin, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 10/995,658

(22) Filed: Nov. 22, 2004

(65) Prior Publication Data

US 2005/0155002 A1   Jul. 14, 2005

Related U.S. Application Data

(62) Division of application No. 10/230,976, filed on Aug. 28, 2002, now Pat. No. 6,842,884.

(51) Int. Cl.
*G06F 17/50* (2006.01)

(52) U.S. Cl. ............................................. 716/5; 716/4

(58) Field of Classification Search ................. 716/4–5
See application file for complete search history.

(56) References Cited

U.S. PATENT DOCUMENTS

| | | | |
|---|---|---|---|
| 5,892,687 A | 4/1999 | Moricz et al. | 716/18 |
| 6,026,222 A | 2/2000 | Gupta et al. | 716/5 |
| 6,056,784 A | 5/2000 | Stanion | 716/5 |
| 6,086,626 A | 7/2000 | Jain et al. | 716/5 |
| 6,301,687 B1 * | 10/2001 | Jain et al. | 716/3 |
| 6,567,959 B2 | 5/2003 | Levin et al. | 715/5 |
| 6,574,778 B2 | 6/2003 | Chang et al. | 716/1 |
| 6,591,400 B1 | 7/2003 | Yang | 716/2 |
| 6,609,230 B1 | 8/2003 | Li | 716/5 |
| 6,874,134 B1 * | 3/2005 | Collin et al. | 716/3 |
| 7,003,743 B2 * | 2/2006 | Abadir et al. | 716/4 |

OTHER PUBLICATIONS

R.E. Bryant, "Graph-based Algorithms for Boolean Function Manipulation," IEEE Transactions on Computers, vol. 35, No. 8, pp. 677-691, Aug. 1986.

(Continued)

*Primary Examiner*—Vuthe Siek
(74) *Attorney, Agent, or Firm*—Heller Ehrman LLP

(57) ABSTRACT

An equivalence checking method provides first and second logic functions. Don't care gates are inserted for don't care conditions in the first and second logic functions. The insertion of the don't care gates creates a first intermediate circuit and a second intermediate circuit. All 3DC gates of the first intermediate circuit are propagated and merged into a single 3DC gate when 3DC gates and SDC gates coexist in either of the first and second intermediate circuits. All 3DC gates of the second intermediate circuit are propagated and merged into a single 3DC gate when 3DC gates and SDC gates coexist in either of the first and second intermediate circuits. First and second circuit are produced in response to propagating and merging the 3DC gates. A combinational equivalence check is then performed of the first circuit to the second circuit under different equivalence relations.

19 Claims, 13 Drawing Sheets

3DC: $f = dx + d'c$    SDC: $f = dx_i + d'c$

OTHER PUBLICATIONS

R.E. Bryant, "On the Complexity of VLSI Implementations and Graph Representations of Boolean Functions with Application to Integer Multiplication," IEEE Transactions on Computers, vol. 40, No. 2, pp. 205-213, Feb. 1991.

D. Brand, "Verification of Large Synthesized Designs" Proceedings of the 1993 IEEE/ACM international conference on Computer-aided design, pp. 534-537, Nov. 1993.

T. Larrabee, "Test Pattern Generation Using Boolean Satisfiability" IEEE Transactions on Computer-Aided Design, vol. 11, pp. 4-15, Jan. 1992.

J.P. Marques-Silva, et al., "Grasp: A Search Algorithm for Propositional Satisfiability" IEEE Transactions on Computers, vol. 48, No. 5, pp. 506-521, May 1999.

H. Zhang, "SATO: An Efficient Propositional Prover," Proceedings of the International Conference on Automated Deduction, pp. 272-275, Jul. 1997.

M.W. Moskewicz, et al., "Chaff: Engineering an Efficient SAT Solver," Proceedings of the 38th Design Automated Conference, pp. 530-535, Jun. 2001.

D. Brand, et al., "Be Careful with Don't Cares," Proceedings of the 1995 IEEE/ACM international conference on Computer-aided design, pp. 83-86, Nov. 1995.

* cited by examiner

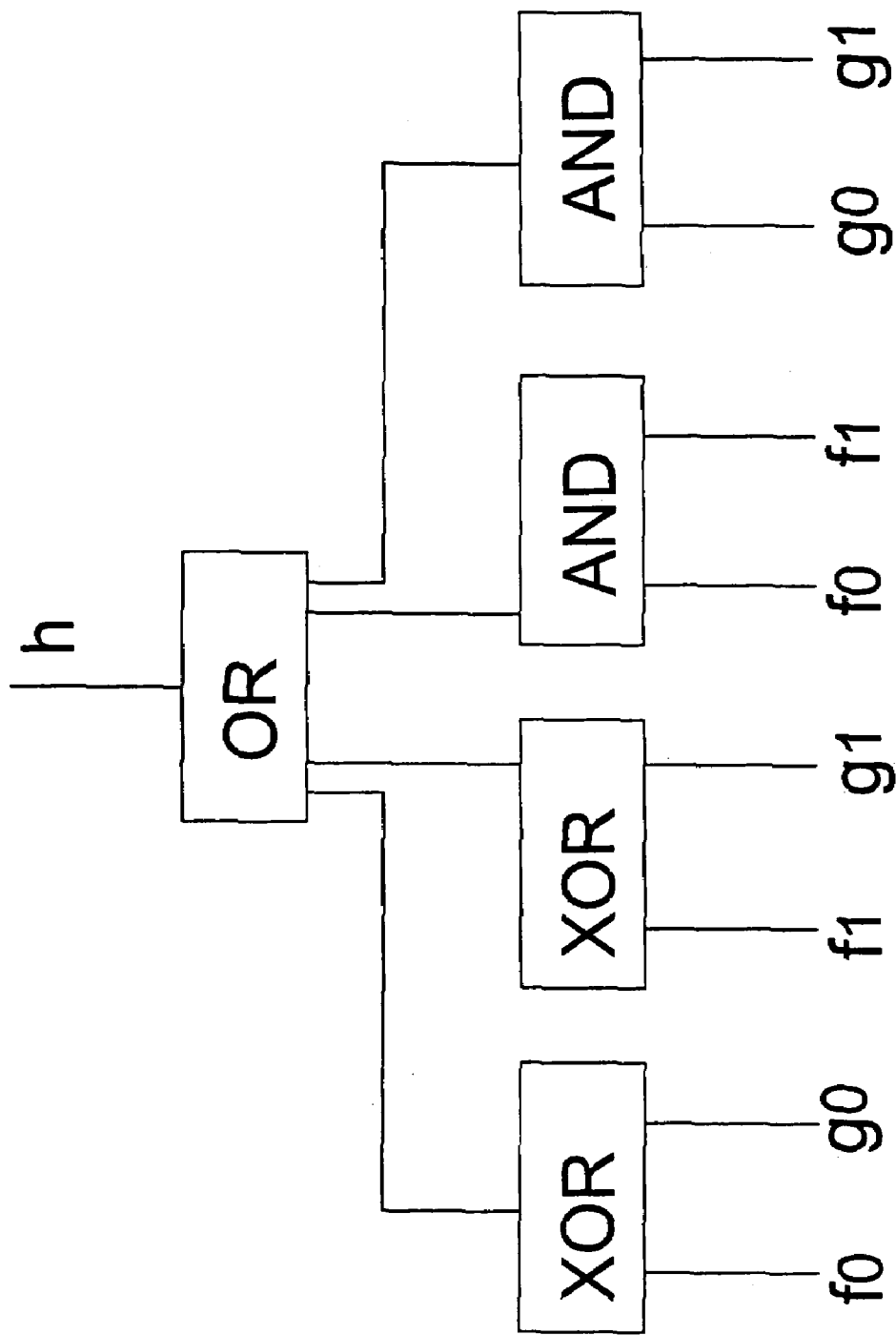
Figure 7: Type 1 Equivalence

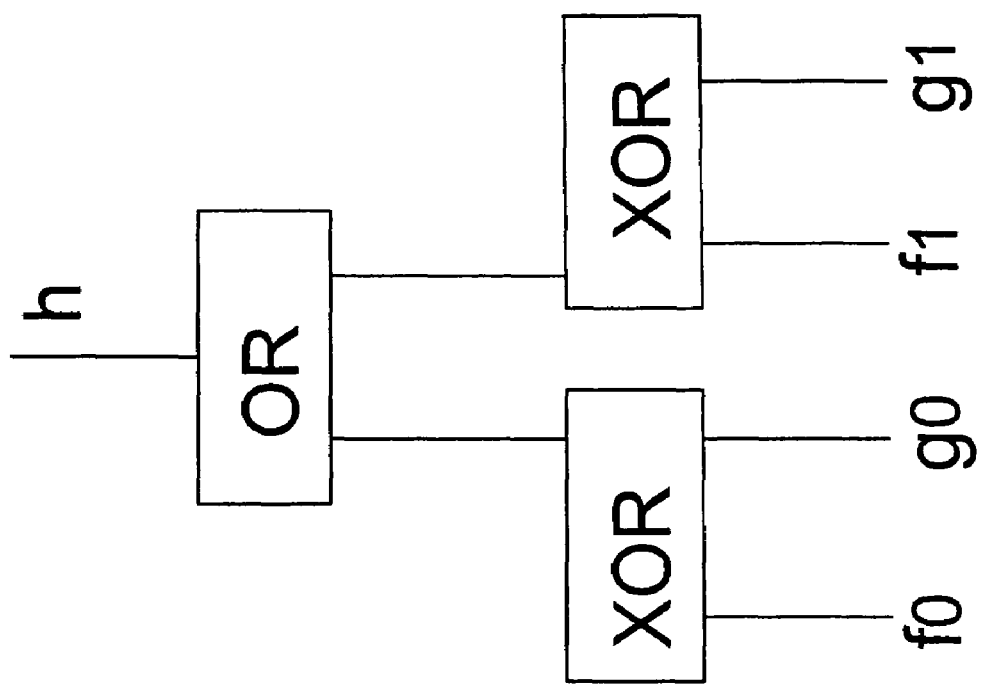
Figure 8: Type 2 Equivalence

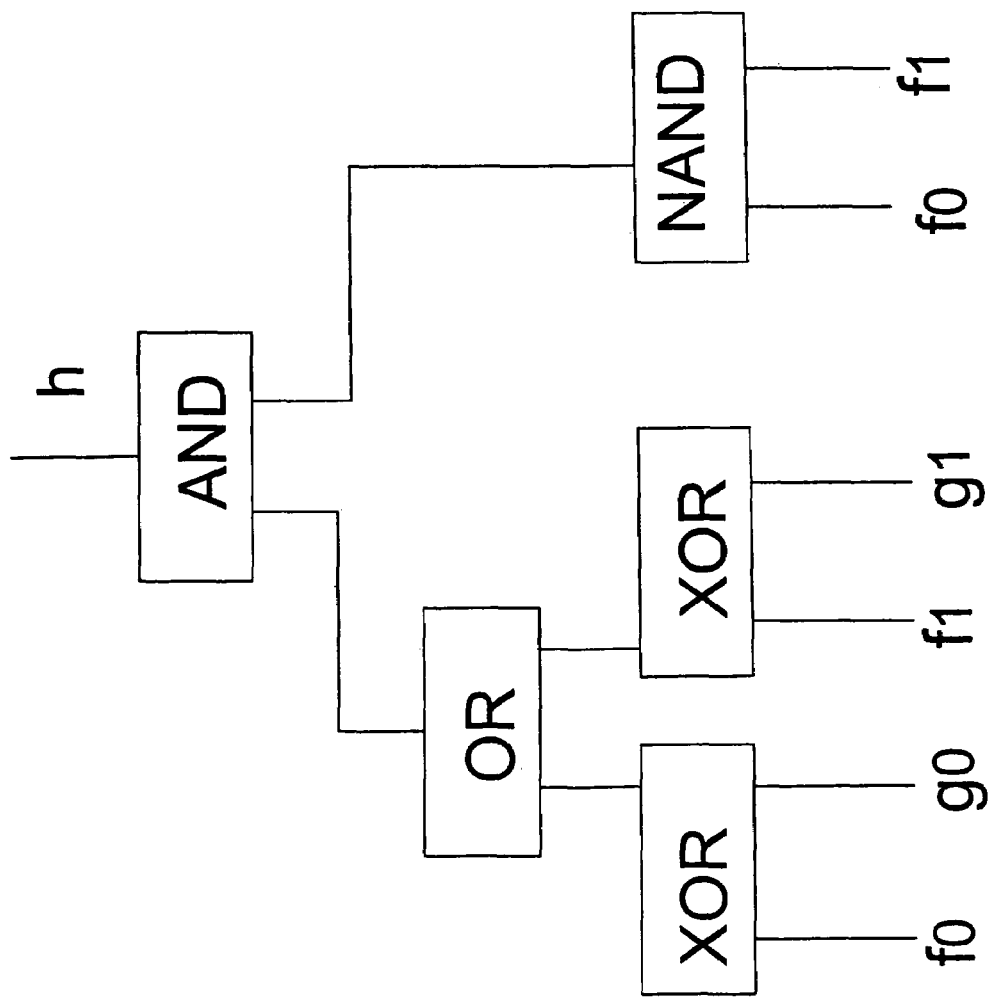
Figure 9: Type 3 Equivalence

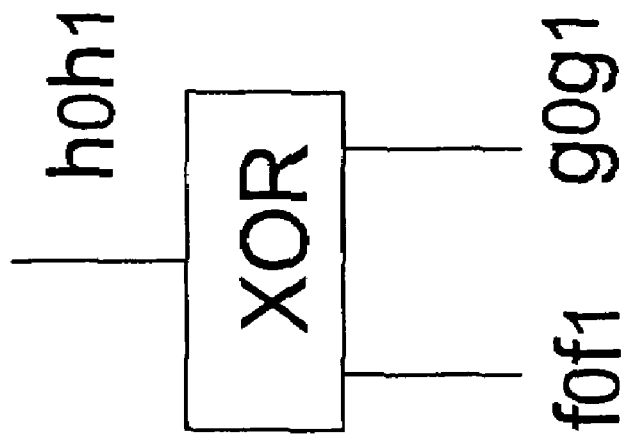
Figure 10: Type 4 Equivalence

COMBINATIONAL EQUIVALENCE CHECKING METHODS AND SYSTEMS WITH INTERNAL DON'T CARES

CROSS REFERENCE TO RELATED APPLICATION

This application is a divisional of U.S. Ser. No. 10/230,976, filed Aug. 28, 2002 now U.S. Pat. No. 6,842,884, which application is fully incorporated herein.

BACKGROUND OF THE INVENTION

1. Field of the Invention

This invention relates generally to circuit equivalence checking, and more particularly to circuit equivalence checking using don't care gates.

2. Description of the Related Art

Logic verification denotes the problem of showing the equivalence between a specification of the intended behavior and a description of the implemented design. At first, simulation is used to carry out logic verification. As the scale of integrated circuits become very large, simulation method become not only very time consuming but also incompetent.

Reduced ordered binary decision diagrams (ROBDDs or BDDs) have been developed, R. E. Bryant, "Graph-based Algorithms for Boolean Function Manipulation," IEEE Trans. Computers., vol. 35, no. 8, pp. 677–691, August 1986, and formal verification has become a practical tool for replacing the function verification part of simulation. Although the success of BDDs is due to its canonical and compact representation of Boolean function, it also suffers two main drawbacks. First, it has memory explosion problem, see R. E. Bryant, "On the Complexity of VLSI Implementations and Graph Representations of Boolean Functions with Application to Integer Multiplication," IEEE Trans. Computers., vol. 40, no. 2, pp. 205–213, February 1991. Second, it is effective for showing two designs are functional equivalent, but it is not effective for finding differences between designs.

For designs that have differences, those techniques used by automatic test pattern generation (ATPG) are more effective, D. Brand, "Verification of Large Synthesized Designs," Proc. 1993 IEEE Intl. Conf. on CAD, pp. 534–537, November 1993. Boolean gates have been transformed to propositional clauses, T. Larrabee, "Test Pattern Generation Using Boolean Satisfiability," IEEE Trans. Computer-Aided Design, vol. 11, pp. 4–15, January 1992. With this transformation, satisfiability (SAT) solving techniques then can also be used to solve ATPG and formal verification problems. Recently, SAT solving techniques have much improvement such that BDD and SAT have become the two major core engines for formal verification. See for example, J. P. Marques-Silva and K. A. Sakallah, "Grasp: A Search Algorithm for Propositional Satisfiability," IEEE Trans. Computers, vol. 48, no. 5, pp. 506–521, May 1999; H. Zhang, "SATO: An Efficient Propositional Prover," Int'l Conference on Automated Deduction, pp. 272–275, July 1997; and M. W. Moskewicz, C. F. Madigan, Y. Zhao, L. Zhang, and S. Malik, "Chaff: Engineering an Efficient SAT Solver," Proc. of 39$^{th}$ Design Automation Conference, pp. 530–535, June 2001.

Internal don't cares may occur in a design specified by register transfer language (RTL), D. Brand, R. A. Bergamaschi, and L. Stok, "Be Careful with Don't Cares," Porc. 1995 IEEE Intl. Conf. on CAD, pp. 83–86, November 1995, such as the following descriptions in an RTL:

1. full_case synthesis directive,
2. parallel_case synthesis directive,
3. X-assignments,
4. index out of range, or
5. user imposed satisfiability constraints.

U.S. Pat. No. 6,026,222 (the "'222 patent") discloses a combinational equivalence checking method based on a partition of the circuits. BDD is used for one partition and SAT is used for the other partition. U.S. Pat. No. 6,086,626 (the "'626 patent") disclose a filtering based methods for combinational equivalence checking. In addition to using BDD and ATGP techniques, '626 patent also uses random simulation and structure hashing methods to speed up the performance of equivalence checking. Both '222 patent and '626 patent do not consider don't cares that may occur in RTL specified designs. Their methods are thus limited to gate-to-gate equivalence checking only.

U.S. Pat. No. 5,892,687 (the "'687 patent") discloses a method for representing internal don't cares that are generated from RTL descriptions. In the '687 patent, the don't care gates are for logic synthesis/optimization but not for equivalence checking. It does not show how the internal don't care gates will affect the output (external) don't care function of the designs.

U.S. Pat. No. 6,056,784 (the "'784 patent") discloses an equivalency method that utilizes don't cares. In the '784 patent, an interval of [m, M] Boolean functions is utilized to represent an ordered pair of (f, d) Boolean functions, where f is the care set and d is the don't care set. Designs are transformed into circuits and each gate is transformed into two gates representing m and M respectively. Equivalence checking is then carried out on those transformed circuits.

In the '784 patent, the Boolean function at any point of the design has the following behavior:

Off set: m'M',

On set: m M, and

Don't care set: m'M.

This is equivalent to 3-valued logic with the encoding of 00 representing value 0, 11 representing value 1, and 01 representing value don't care. Under 3-valued logic, the complementation of a don't care is still a don't care, that is, x'=x. On other model of don't cares where a don't care value is either value 0 or value 1, the complementation of a don't care is different from the don't care itself, that is x'!=x. Furthermore, under such a model, x'x=0 and x'+x=1. These two don't care models have similar but not the same behavior. For example, in FIG. 1(a), the output has value don't care that is under 3-valued model, and in FIG. 1(b), the output has value 0 that is under the other model. The method disclosed in the '784 patent is limited in that after the transformation only one don't care model can be applied for its equivalence checking. When other don't care model is required, the single don't care model based equivalence checking may not yield a correct result.

There is a need for equivalence checking that can utilize more than one type of don't care model.

SUMMARY OF THE INVENTION

Accordingly, an object of the present invention is to provide improved methods for equivalence checking, as well as their associated equivalence checking apparatus and computer systems.

Another object of the present invention is to provide methods for equivalence checking using don't care gates, and their associated equivalence checking apparatus and computer systems.

A further object of the present invention is to provide methods for equivalence checking using more than one type of don't care gate, as well as their associated equivalence checking apparatus and computer systems.

Yet another object of the present invention is to provide methods for equivalence checking that depending on the existence of don't care gates in the circuits employ different techniques, as well as their associated equivalence checking apparatus and computer systems.

These and other objects of the present invention are achieved in a method of equivalence checking. First and second logic functions are provided. Don't care gates are inserted for don't care conditions in the first and second logic functions. The insertion of the don't care gates creates a first intermediate circuit and a second intermediate circuit. All 3DC gates (using a 3-valued logic based don't care model) of the first intermediate circuit are propagated and merged into a single 3DC gate when 3DC gates and SDC gates (using a symbolic based don't care model) coexist in either of the first and second intermediate circuits. All 3DC gates of the second intermediate circuit are propagated and merged into a single 3DC gate when 3DC gates and SDC gates coexist in either of the first and second intermediate circuits. First and second circuits are produced in response to propagating and merging the 3DC gates. A combinational equivalence check is then performed of the first circuit to the second circuit under different equivalence relations.

In another embodiment of the present invention, a circuit equivalence checking apparatus includes a first processor for inserting don't care gates for don't care conditions in first and second logic functions. The first processor creates a first intermediate circuit and a second intermediate circuit. A second processor propagates and merges all 3DC gates of the first intermediate circuit into a single 3DC gate when 3DC gates and SDC gates coexist in either of the first and second intermediate circuits. The second processor propagates and merges all 3DC gates of the second intermediate circuit into a single 3DC gate when 3DC gates and SDC gates coexist in either of the first and second intermediate circuits. The second processor produces first and second circuits. A third processor is provided that performs a combinational equivalence check of the first circuit to circuit the second circuit.

In another embodiment of the present invention, an apparatus for effecting equivalence checking includes first and second logic functions. Don't care gates are generated in the first and second logic functions in response to don't care conditions in the first and second logic functions. This results in the creation of first and second intermediate circuits. A single 3DC gate is in each of the first and second intermediate circuits and formed by propagating and merging all 3DC gates of the first intermediate circuit and the second intermediate circuit when 3DC gates and SDC gates coexist in either of the first and second intermediate circuits. The apparatus includes first circuit and a second circuit and a combinational equivalence checker of the first circuit to the second circuit.

In another embodiment of the present invention, a computer system is provided that performs equivalence checking. The computer system includes a memory that has software instructions. The software instructions enable the computer system to perform the steps of, (i) providing a first logic function and a second logic function, (ii) inserting don't care gates in the first and second logic functions in response to don't care conditions in the first and second logic functions to create a first intermediate circuit and a second intermediate circuit, (iii) propagating and merging all 3DC gates of the first intermediate circuit into a single 3DC gate when 3DC gates and SDC gates coexist in either of the two intermediate circuits, (iv) propagating and merging all 3DC gates of the second intermediate circuit into a single 3DC gate when 3DC gates and SDC gates coexist in either of the two intermediate circuits. (v) producing a first circuit and a second circuit in response to propagating and merging the 3DC gates and (vi) in response to the first and second circuits, performing a combinational equivalence check of the first circuit to the second circuit.

In another embodiment of the present invention, a method of equivalence checking provides first and second logic functions. 3DC or SDC gate are inserted in the first and second logic functions when there are don't care conditions in the first and second logic functions. First and second circuits are created. A combinational equivalence check is made of the first circuit to the second circuit.

In another embodiment of the present invention, a circuit equivalence checking apparatus includes a first process that inserts don't care gates for don't care conditions in the first and second logic functions. The first processor creates first and second circuits. A second processor provides a combinational equivalence check of the first circuit to the second circuit.

In another embodiment of the present invention, an apparatus for effecting equivalence checking includes first and second logic functions. Don't care gates are inserted for don't care conditions in the first and second logic functions. First and second circuits are created. A combinational equivalence checker is used to compare the first and second circuits.

In another embodiment of the present invention, a computer system adapted to perform equivalence checking includes a memory. The memory has software instructions adapted to enable the computer system to perform the steps of, (i) providing a first logic function and a second logic function, (ii) inserting don't care gates in the first and second logic functions in response to don't care conditions in the first and second logic functions to create a first circuit and a second circuit, and (iii) in response to the first and second circuits, performing a combinational equivalence check of the first circuit to the second circuit.

BRIEF DESCRIPTION OF THE FIGURES

FIG. 7 is a block diagram that illustrates one embodiment of Type 1 equivalence.

FIG. 8 is a block diagram that illustrates one embodiment of Type 2 equivalence.

FIG. 9 is a block diagram that illustrates one embodiment of Type 3 equivalence.

FIG. 10 is a block diagram that illustrates one embodiment of Type 4 equivalence.

DESCRIPTION OF THE PREFERRED EMBODIMENTS

Figure 1:
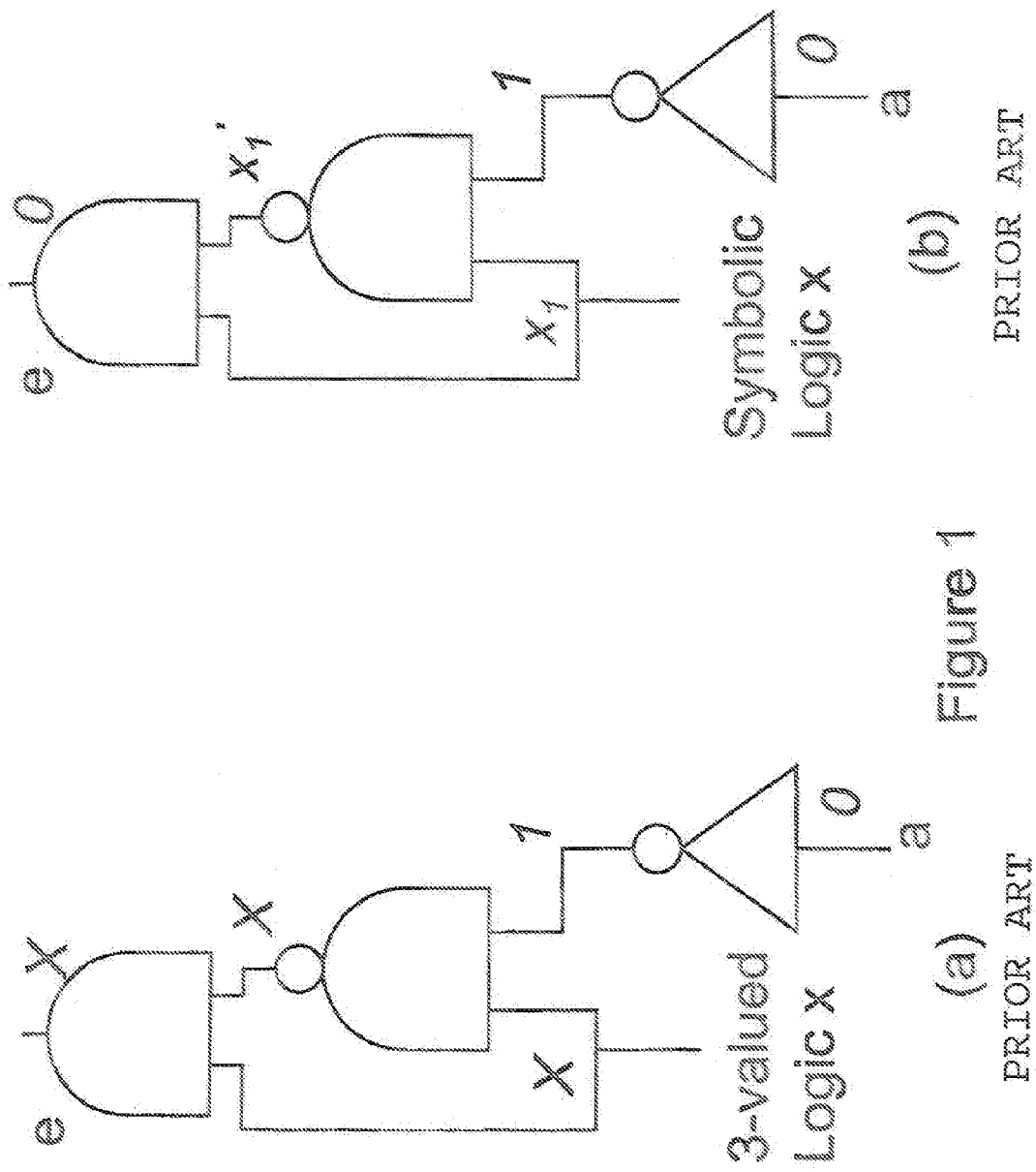
FIGS. 1(a) and 1(b) illustrate the different behavior under different don't care models of the prior art.
Figure 2:
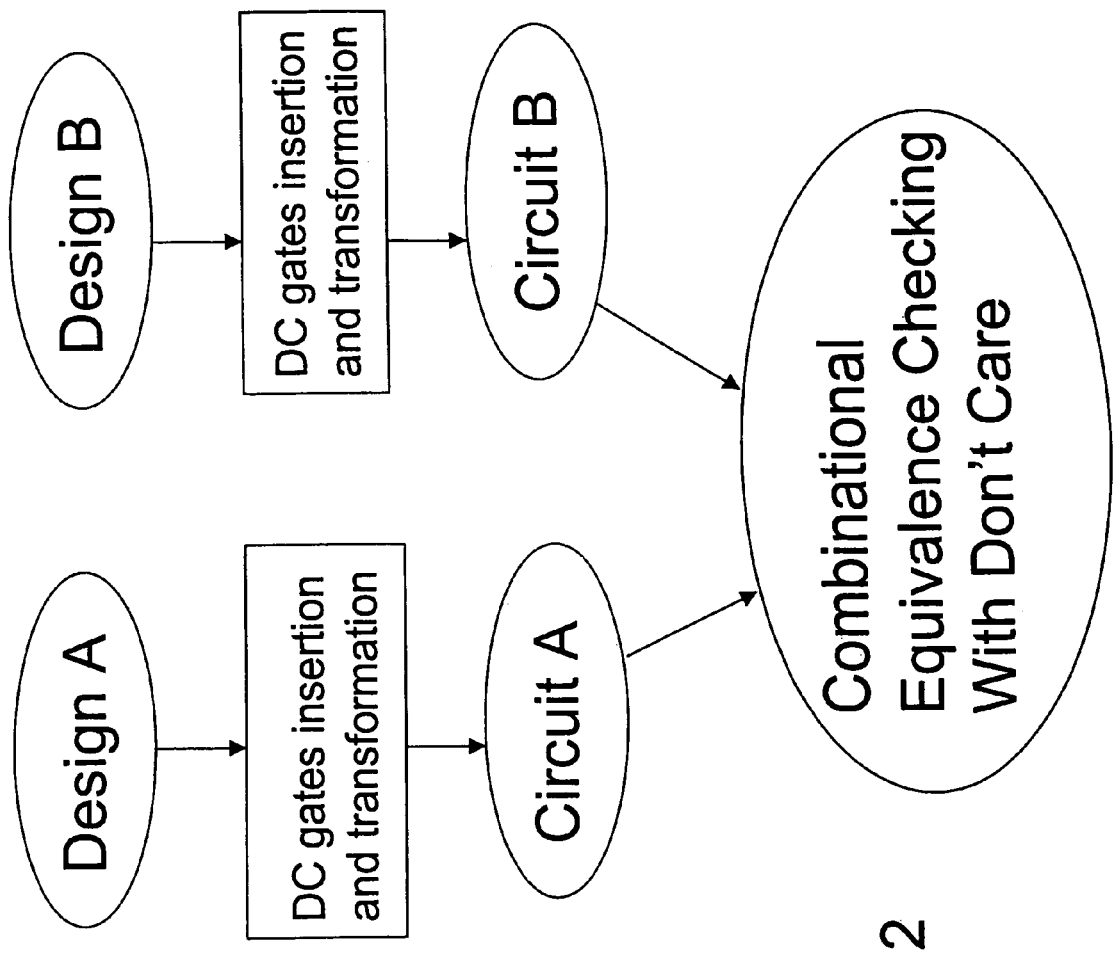
FIG. 2 is a flow chart illustrating one embodiment of a equivalence checking of the present invention.

Referring to FIG. 2, in various embodiments, the present invention provides methods for equivalence checking, circuit equivalence checking apparatus, and computer systems adapted to perform equivalence checking.

In one method of equivalence checking of the present invention, first and second logic functions are provided. Don't care gates are inserted in the first and second logic functions in response to don't care conditions in the first and second logic functions. A don't care gate is a combinational gate with two inputs c and d and an output f. The don't care gate has the following function behavior: if d has value 1 then f has value don't care, otherwise, f has value c.

With the present invention, more than one type of don't care gate can be used for equivalence checking. The first type of don't care gate has a don't care value $x_i$ of 0 or 1 (a symbolic don't care or SDC). The second type has a don't care value of 'x' (3-valued don't care, or 3DC). Which types of don't care gates are inserted can be controlled by the users or automatically determined by the method.

Figure 3:
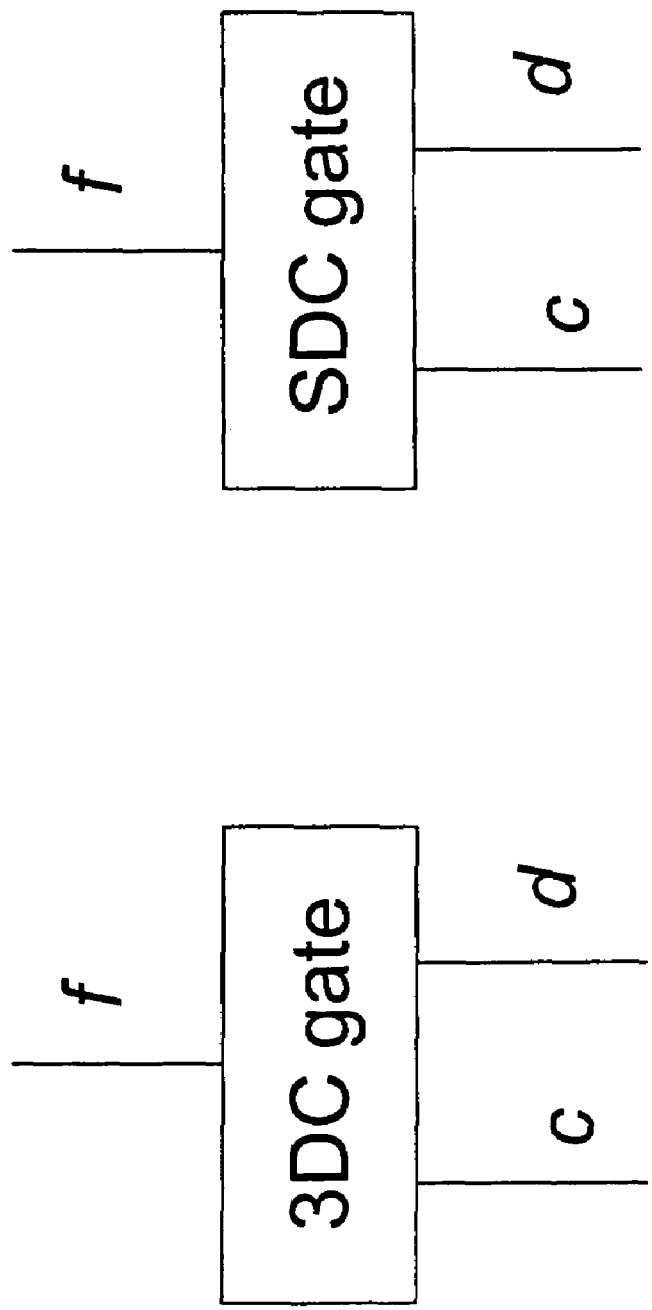
FIG. 3 is a block diagram illustrating one embodiment of 3DC and SDC gates of the present invention.

FIG. 3 illustrates the 3DC and SDC gates. The main difference between $x_i$ and x is in their complement form, that is, $x_i$ has complement form while x has not. Thus, $x_i + x_i' = 1$ and $x_i x_i' = 0$ while $x + x' = x$ and $x \cdot x' = x$.

Each SDC gate can be a combinational gate with c and d inputs and output f, where:
  if d has a value of 0 then f has value c;
  if d has a value of 1 then f has value $x_i$;
  if d has a value of x then f has value x; and
  if d has a value of $x_j$ then f has value $x_j x_i + x_j' c$.

Each 3DC gate can be a combinational gate with c and d inputs and an output f, where:
  if d has a value of 0 then f has value c;
  if d has a value of 1 then f has value x;
  if d has a value of x then f has value x; and
  if d has a value of $x_i$ then f has value x.

First and second intermediate circuits are then created. By way of illustration, and without limitation, a don't care condition can occur in a (i) full case synthesis directive, (ii) parallel case synthesis directive, (iii) an index that is out of range, (iv) an X-assignment, (v) a user imposed satisfiability constraint, and the like.

When 3DC gates and SDC gates coexist in the first and/or second intermediate circuits all 3DC gates of the first and second intermediate circuit are propagated and then merged into a single 3DC gate. The result, in this embodiment of coexistence, is a single 3DC gate in each of the first and second intermediate circuit that is the last output gate.

Figure 4A:
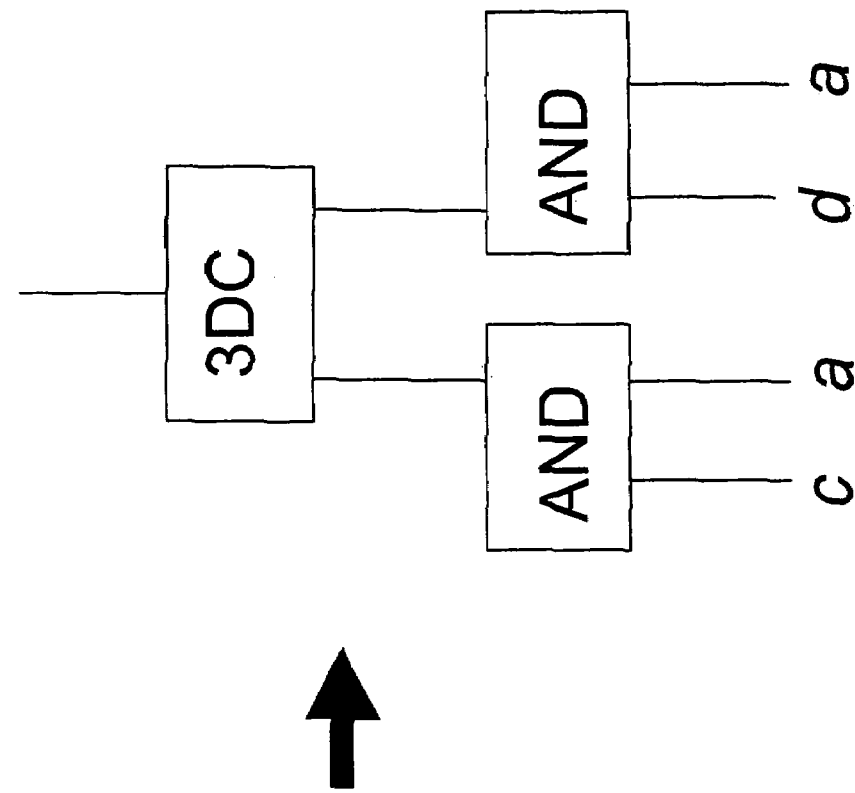
FIG. 4(a) is a block diagram of an embodiment of the present invention where a 3DC gate propagates past a non-inverted Boolean gate.
Figure 4A:
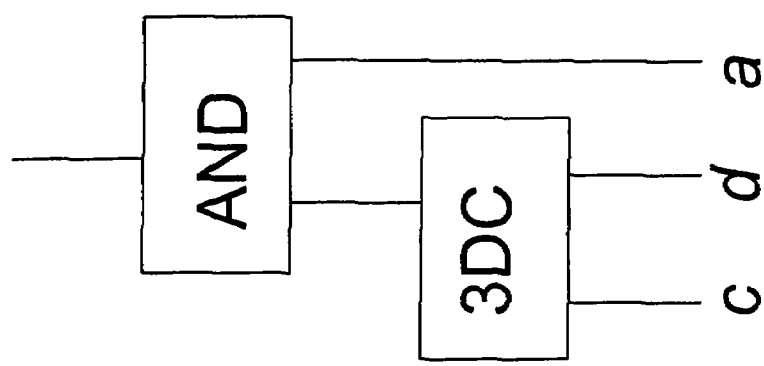
Figure 4B:
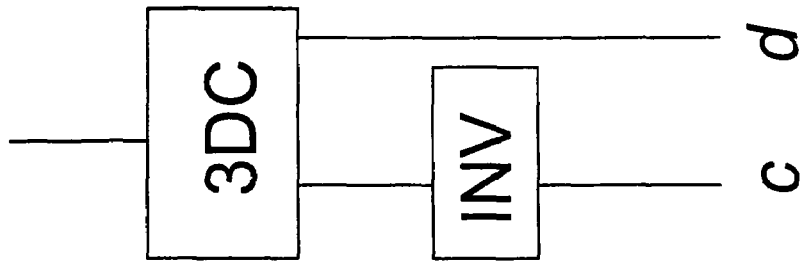
FIG. 4(b) is a block diagram of an embodiment of the present invention where a 3DC gate propagates past an inverted Boolean gate.
Figure 4B:
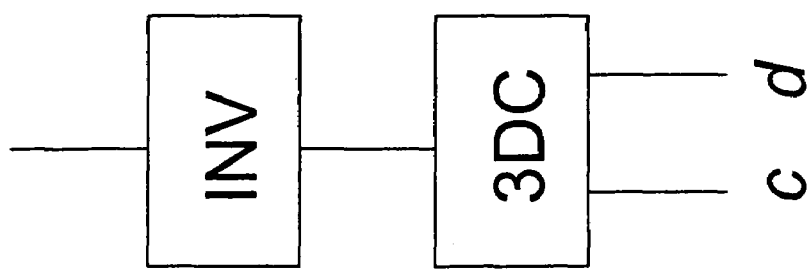
Figure 5A:
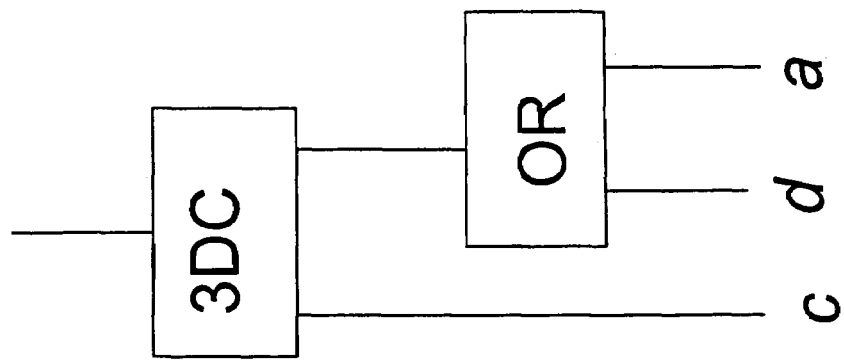
FIG. 5(a) is a block diagram of an embodiment of the present invention where a 3DC gate propagates past another 3DC gate.
Figure 5A:
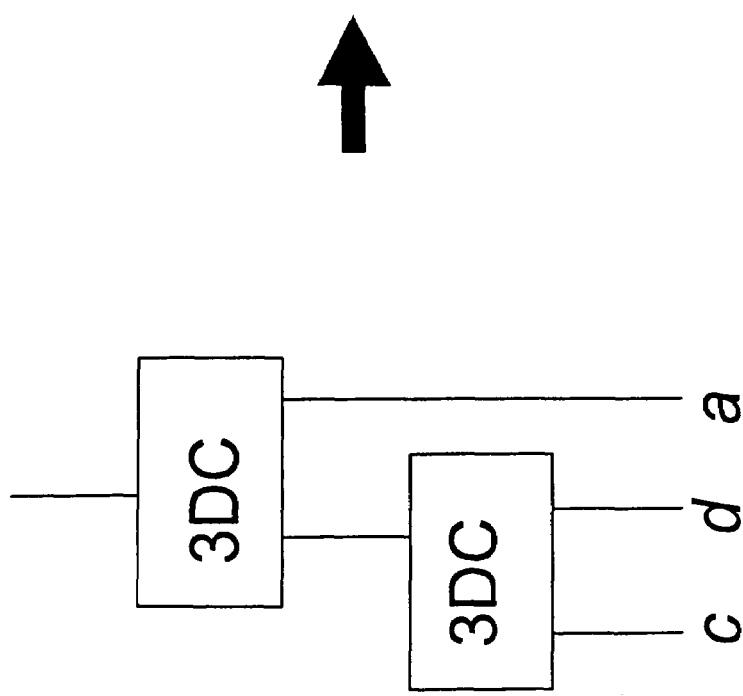
Figure 5B:
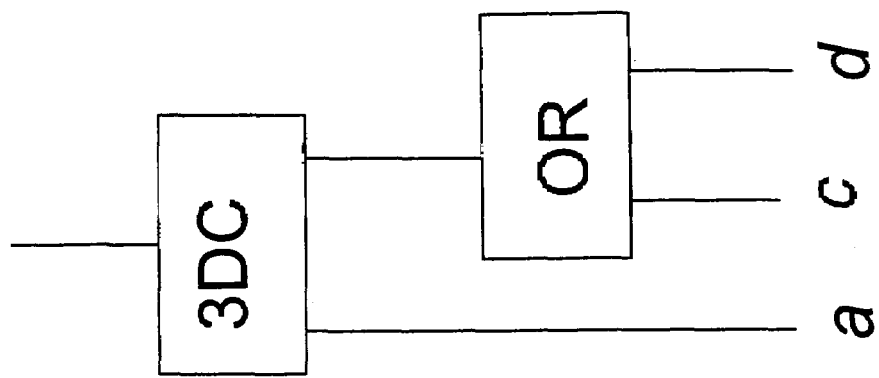
FIG. 5(b) illustrates another embodiment of a 3DC gate propagating past another 3DC gate of the present invention.
Figure 5B:
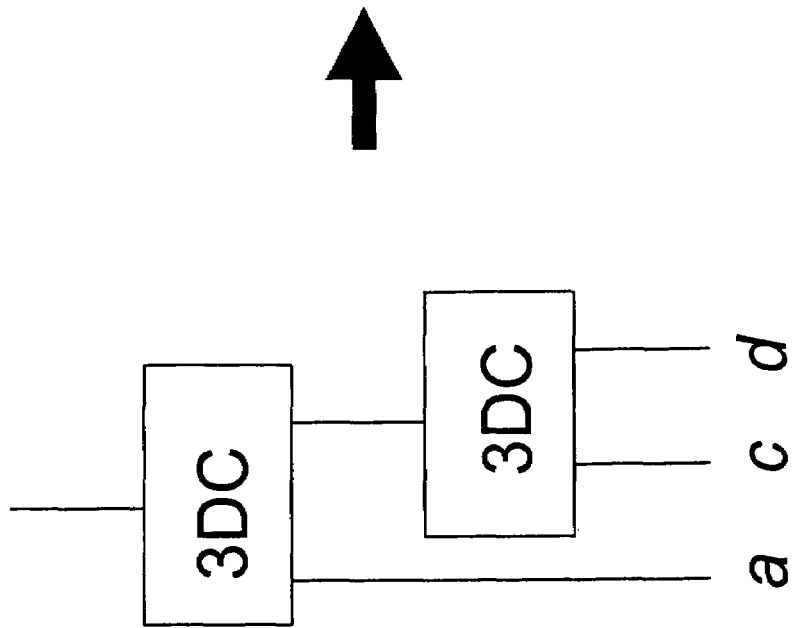
Figure 6A:
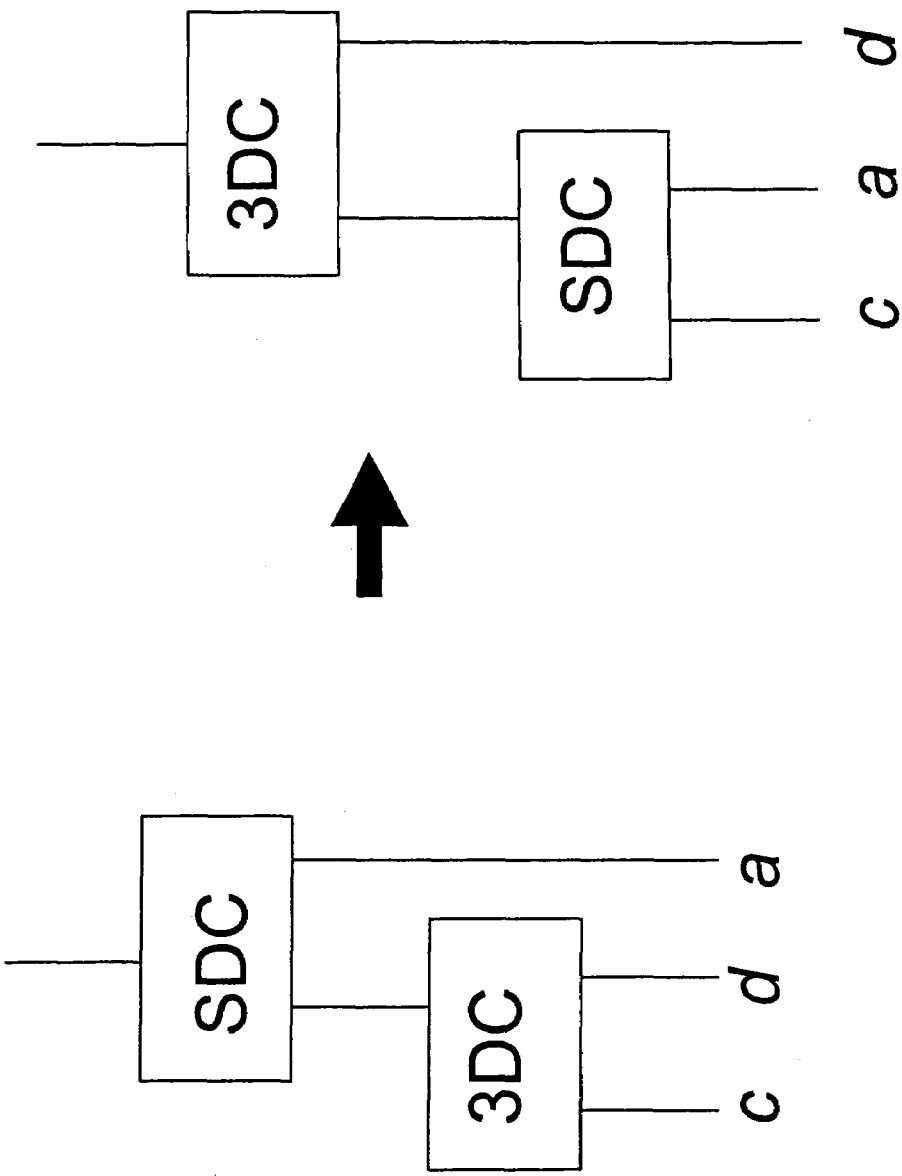
FIG. 6(a) is a block diagram of an embodiment of the present invention where a 3DC gate propagates past an SDC gate.
Figure 6B:
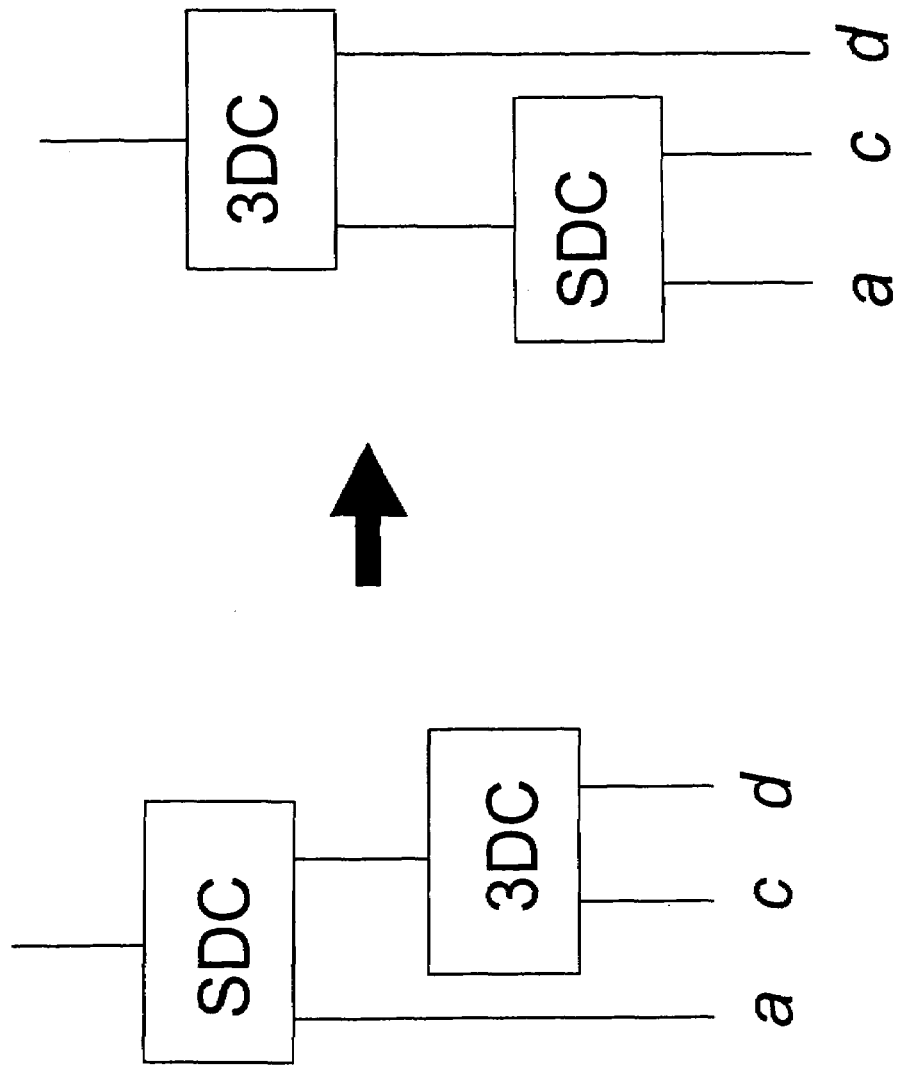
FIG. 6(b) is a block diagram from another embodiment of a 3DC gate propagating past an SDC gate of the present invention.

FIG. 4(a) illustrates that a 3DC gate propagates past a non-inverted Boolean gate. FIG. 4(b) illustrates a 3DC gate that propagates past an inverted Boolean gate. FIGS. 5(a) and 5(b) show generally how a 3DC gate propagates past another 3DC gate In FIG. 5(a), the first 3DC gate is the c input of the second 3DC gate, and in FIG. 5(b), the first 3DC gate is the d input of the second 3DC gate. This results in a single 3DC gate that follows an OR gate. FIGS. 6(a) and 6(b) generally illustrate how a 3DC gate propagates past an SDC gate. In FIG. 6(a), the first 3DC gate is the c input of the second SDC gate, and in FIG. 6(b), the first 3DC gate is the d input of the SDC gate. This results in a single 3DC gate that follows an SDC gate.

From the first and second intermediate circuits, first and second circuits are created. A combinational equivalence check is then made of the first circuit to the second circuit. The combinational equivalence check can be under different equivalence relations.

The equivalence relation can be one of four. In Type 1, the two compared values are equivalent if both are 0 or 1. In type 2, the two compared values are equivalent if both are 0 or 1, or both are an x or an $x_i$. In type 3, the two compared values are equivalent if both are 0, 1, or the first value is an x or an $x_i$. In Type 4, the two compared values are equivalent when both are 0, 1 or either has a value of x or $x_i$.

Depending on the existence of don't care gates in the circuits, different techniques are used for equivalence checking. When there is no don't care gate, BDD and SAT are used to perform equivalence checking. When there are only 3DC gates, 3VSAT and 3VBDD are used; in other cases only BDD is used.

By way of illustration, and without limitation, for 3-valued logic, the following encoding can be utilized for 3VSAT and 3VBDD:
  01 represents 0,
  10 represents 1,
  11 represents x, and
  00 is not used.

In the following, clauses for 3VSAT and BDD operations for 3VBDD are generated. This shows only an AND-gate, NOT-gate, and 3DC gate. It will be appreciated that other gates can be carried out in a similar way.

With an AND-gate that has inputs a and b, and output f where a is encoded by $a_0 a_1$, b is encoded by $b_0 b_1$, and f is encoded by $f_0 f_1$. The following clauses are generated for 3VSAT:
  $(a_0 + f_0')(b_0 + f_0')(a_0' + b_0' + f0)$
  $(a_1' + f_1)(b_1' + f_1)(a_1 + b_1 + f_1')$.

The following BDD operations are used for constructing 3VBDD:
  $<bdd\_f_0, bdd\_f_1> = <bdd\_and(bdd\_a_0, bdd\_b_0), bdd\_or(bdd\_a_1, bdd\_b_1)>$.

Given a NOT-gate with input a and output f where a is encoded by $a_0 a_1$ and f is encoded by $f_0 f_1$. The following clauses are generated for 3VSAT:
  $(a_0' + f_1)(a_0 + f_1')$ $(a_1' + f_0)(a_1 + f_0')$.

The following BDD operations are used for constructing 3VBDD:
  $<bdd\_f_0, bdd\_f_1> = <bdd\_a_1, bdd\_a_0>$.

Given a 3DC-gate with inputs c and d and output f, where c is encoded by $c_0 c_1$, d is encoded by $d_0 d_1$, and f is encoded by $f_0 f_1$.

The following clauses are generated for 3VSAT:
  $(d_0 + d_1' + c_0' + f_0)(d_0 + d_1' + c_0 + f_0')$ $(d_0 + d_1' + c_1' + f_1)$ $(d_0 + d_1' + c_1 + f_1')(d_0' + f_0)(d_0' + f_1)$.

The following BDD operations are used for constructing 3VBDD:

$<bdd\_f_0, bdd\_f_1> = <bdd\_or(bdd\_d_0, bdd\_and(bdd\_d_1, bdd\_c_0)). bdd\_or(bdd\_d_0, bdd\_and(bdd\_d_1, bdd\_c_1))>$.

Let the outputs of two circuits to be compared be f and g, where f is encoded by $f_0f_1$ and g is encoded by $g_0g_1$.

FIGS. 7–10 shows how four types of equivalence relations can be checked by 3VSAT and 3VBDD.

The following shows how check equivalence relations can be achieved when there are SDC gates in the circuits. Again by illustration, and without limitation, given an SDC gate with inputs c and d, and output f its function behavior can be computed as follows:

$bdd\_f = bdd\_ite(bdd\_d, bdd\_x_i, bdd\_c)$, where $bdd\_x_i$ is a new BDD variable for this gate.

Let the outputs of two circuits to be compared be f and g, and their BDD representations are $bdd\_f$ and $bdd\_g$ respectively.

The following algorithm can be used to check Type 1 Equivalence:

```
if bdd_get_support(bdd_f) contains any bdd_x_i
then Non-Equivalent;
    else if bdd_get_support(bdd_g) contains any bdd_x_i
then Non-Equivalent;
    else {
        bdd_h = bdd_xnor(bdd_f, bdd_g)
        if bdd_h is a constant 1 then Equivalent
        else Non-Equivalent
    }
```

The following algorithm can be used to check Type 2 Equivalence:

```
support_f = bdd_get_support(bdd_f);
support_g = bdd_get_support(bdd_g);
if(support_f - support_g) is not empty then Non-Equivalent;
else if (support_g - support_f) is not empty then Non-Equivalent;
else {
    bdd_h = bdd_xnor(bdd_f, bdd_g);
    if bdd_h is constant 1 then Equivalent
    else Non-Equivalent
}
```

The following algorithm can be used for checking Type 3 Equivalence:

```
support_f = bdd_get_support(bdd_f);
support_g = bdd_get_support(bdd_g);
if(support_g - support_f) is not empty then Non-Equivalent
else {
    bdd_h = bdd_xnor(bdd_f, bdd_g);
    bdd_s = bdd_smooth(bdd_h, array_of_bdd_x_i);
    if bdd_s is constant 1 then Equivalent;
    else Non-Equivalent;
}
```

The following algorithm can be used for checking Type 4 Equivalence:

```
bdd_h = bdd_xnor(bdd_f, bdd_g);
bdd_s = bdd_smooth(bdd_h, array_of bdd_x_i);
if bdd_s is constant 1 then Equivalent;
else Non-Equivalent.
```

When there are both 3DC and SDC gates exist in the circuits, 3DC gates are first propagated and merged such that there is only one 3DC gate left and it becomes the last gate of the circuits. The single 3DC gate then has the same behavior as that of an SDC gate. Thus, all the above algorithms that are for SDC gates can also be used for the case when both 3DC and SDC gates exist at the same time.

The present invention is also a circuit equivalence checking apparatus that includes a first processor for inserting don't care gates in first and second logic functions. The first processor inserts the don't care gates in response to don't care conditions in the first and second logic functions, and creates first and second intermediate circuits. A second processor propagates and merges all 3DC gates of the first intermediate circuit into a single 3DC gate when 3DC gates and SDC gates coexist in either of the intermediate circuits. The second processor propagating and merging all 3DC gates of the second intermediate circuit into a single 3DC gate when 3DC gates and SDC gates coexist in either of the intermediate circuits. The second processor produces first and a second circuit. A third processor is configured to perform a combinational equivalence check of the first circuit to the second circuit.

The present invention also provides an apparatus for effecting equivalence checking includes a first logic function and a second logic function. Don't care gates are generated in the first and second logic functions when there are don't care conditions in the first and second logic functions. The first and second logic functions are used to create the first and second intermediate circuits. A single 3DC gate is in the first and second intermediate circuits. The single 3DC gates are formed when 3DC gates and SDC gates coexist in either of the first and second intermediate circuits. The apparatus also includes the first and second circuits, and a combinational equivalence checker for the first circuit to the second circuit.

In yet another embodiment of the present invention, a computer system is provided that is adapted to perform equivalence checking. The computer system includes a memory with software instructions adapted to enable the computer system to perform the steps of, (i) providing a first logic function and a second logic function, (ii) inserting don't care gates in the first and second logic functions in response to don't care conditions in the first and second logic functions to create a first intermediate circuit and a second intermediate circuit; (iii) propagating and merging all 3DC gates of the first intermediate circuit into a single 3DC gate when 3DC gates and SDC gates coexist in either of the intermediate circuits, (iv) propagating and merging all 3DC gates of the second intermediate circuit into a single 3DC gate when 3DC gates and SDC gates coexist in either of the intermediate circuits, (v) producing a first circuit and a second circuit in response to propagating and merging the 3DC gates, and (vi) in response to the first and second circuits, performing a combinational equivalence check of the first circuit to the second circuit.

In another method of the present invention, a method of equivalence checking provides the first logic function and a second logic function. Don't care gates are inserted in the first and second logic functions when there are don't care conditions in the first and second logic functions. The first and second circuits are then created. A combinational equivalence check is performed of the first circuit to the second circuit.

In this equivalence checking method embodiment, a don't care condition can occur in a full_case synthesis directive, a parallel_case synthesis directive, an index that is out of range, an X-assignment, or a user imposed satisfiability constraint, and the like.

The combinational equivalence check includes applying BDD and SAT to represent a function behavior, and also checks an equivalence if there are no DC gates in the first and second circuits. In this embodiment, the combinational equivalence check can include applying 3VSAT and 3VBDD to represent a function behavior, and to check an equivalence if there are only 3DC gates in the first and second circuits. Further, the combinational equivalence check can include applying BDD to represent a function behavior and to check an equivalence if there are only SDC gates in the circuits.

The present invention can also be a circuit equivalence checking apparatus with a first processor configured to insert don't care gates in first and second logic functions in response to don't care conditions in the first and second logic functions. The first processor creates the first and second circuits. A second processor is included that is configured to do a combinational equivalence check of the first circuit to the second circuit.

In another embodiment, the present invention provides an apparatus for effecting equivalence checking. First and second logic functions are included. Don't care gates are inserted in the first and second logic functions in response to don't care conditions in the first and second logic functions. First circuit and second circuits are provided along with a combinational equivalence checker of the first circuit to the second circuit.

The present invention is also a computer system adapted to perform equivalence checking. A memory includes software instructions adapted to enable the computer system to perform the steps of, (i) providing first and second logic functions, (ii) inserting don't care gates in the first and second logic functions in response to don't care conditions in the first and second logic functions to create first and second circuits, and (iii) performing a combinational equivalence check of the first circuit to the second circuit.

What is claimed is:

1. A method of equivalence checking, comprising:
   providing a first logic function and a second logic function;
   inserting 3-valued don't care or Symbolic Don't Care gate in the first and second logic functions in response to don't care conditions in the first and second logic functions to create a first circuit and a second circuit;
   in response to the first and second circuits, performing a combinational equivalence check of the first circuit to The second circuit, wherein the combinational equivalence check includes applying 3-valued structural satisfiability and 3-valued binary decision diagrams to represent a function behavior and to check an equivalence if there are only 3-valued don't care gates in the first and second circuits.

2. The method of claim 1, wherein a don't care value in each Symbolic Don't Care gate is 0 or 1, and a don't care value of each 3-valued don't care gate is "x", where x is not 0 nor 1.

3. The method of claim 1, wherein a don't care condition can occur in a full case synthesis directive.

4. The method of claim 1, wherein a don't care condition can occur in a parallel case synthesis directive.

5. The method of claim 1, wherein a don't care condition can occur in an index that is out of range.

6. The method of claim 1, wherein a don't care condition can occur in an X-assignment.

7. The method of claim 1, wherein a don't care condition can occur in a user imposed satisfiability constraint.

8. The method of claim 1, wherein the combinational equivalence check includes applying Binary Decision Diagrams and structural satisfiability to represent a function behavior and to check an equivalence if there are no Don't Care gates in the first and second circuits.

9. The method of claim 1, wherein the combinational equivalence check includes applying Binary Decision Diagrams to represent a function behavior and to check an equivalence if there are only Symbolic Don't Care gates in the circuits.

10. The method of claim 1, wherein the equivalence relation is two compared values are equivalent if both are 0 or 1.

11. The method of claim 1, wherein the equivalence relation is two compared values are equivalent if both are 0, 1, or both are an x or an $x_i$.

12. The method of claim 1, wherein the equivalence relation is two compared values are equivalent if both are 0, 1, or the first value is an x or an $x_i$.

13. The method of claim 1, wherein the equivalence relation is two compared values are equivalent if both are 0, 1, or either has a value of x or $x_i$.

14. A circuit equivalence checking apparatus, comprising:
   a first processor for inserting don't care gates in first and second logic functions in response to don't care conditions in the first and second logic functions, the first processor creating a first intermediate circuit and a second intermediate circuit;
   a second processor propagating and merging all 3-valued don't care gates of the first intermediate circuit into a single 3-valued don't care gate when 3-value don't care gates and Symbolic Don't Care gates coexist in either of the first and second intermediate circuits, the second processor propagating and merging all 3-valued don't care gates of the second intermediate circuit into a single 3-valued don't care gate when 3-valued don't care gates and Symbolic Don't Care gates coexist in either of the first and second intermediate circuits, the second processor producing a first and second circuit;
   a third processor configured to perform a combinational equivalence check of the first circuit to the second circuit.

15. An apparatus for effecting equivalence checking, comprising:
   a first logic function and a second logic function;
   at least first and second don't care gates in the first and second logic functions in response to don't care conditions in the first and second logic functions to create a first intermediate circuit and a second intermediate circuit;
   a 3-valued don't care gate in each of first and second intermediate circuits, each 3-valued don't care gate formed by propagating and merging all 3-valued don't care gates of the first intermediate circuit, and propagating and merging all 3-valued don't care gates of the second intermediate circuit when 3-valued don't care gates and Symbolic Don't Care gates coexist in either of the first and second intermediate circuits;
   a first circuit and a second circuit; and
   a combinational equivalence checker of the first circuit to the second circuit.

16. A computer system adapted to perform equivalence checking, comprising:
   a memory including software instructions adapted to enable the computer system to perform the steps of:

providing a first logic function and a second logic function;

inserting don't care gates in the first and second logic functions in response to don't care conditions in the first and second logic functions to create a first intermediate circuit and a second intermediate circuit;

propagating and merging all 3-valued don't care gates of the first intermediate circuit into a single 3-valued don't care gate when 3-valued don't care gates and Symbolic Don't Care gates coexist in either of the intermediate circuits;

propagating and merging all 3-valued don't care gates of the second intermediate circuit into a single 3-valued don't care gate when 3-valued don't care gates and Symbolic Don't Care gates coexist in either of the intermediate circuits;

producing a first circuit and a second circuit in response to propagating and merging the 3-valued don't care gates; and in response to the first and second circuits, performing a combinational equivalence check of the first circuit to the second circuit.

17. A circuit equivalence checking apparatus, comprising:

a first processor configured to insert don't care gates in first and second logic functions in response to don't care conditions in the first and second logic functions, the first processor creating a first circuit and a second circuit; and a second processor configured to provide a combinational equivalence check of the first circuit to the second circuit, wherein the combinational equivalence check includes applying 3-valued structural satisfiability and 3-valued binary decision diagrams to represent a function behavior and to check an equivalence if there are only 3-valued don't care gates in the first and second circuits.

18. An apparatus for effecting equivalence checking, comprising:

a first logic function and a second logic function;

don't care gates inserted in the first and second logic functions in response to don't care conditions in the first and second logic functions;

a first circuit and a second circuit; and a combinational equivalence checker of the first circuit to the second circuit, wherein the combinational equivalence checker is configured to apply 3-valued structural satisfiability and 3-valued binary decision diagrams to represent a function behavior and to check an equivalence if there are only 3-valued don't care gates in the first and second circuits.

19. A computer system adapted to perform equivalence checking, comprising:

a memory including software instructions adapted to enable the computer system to perform the steps of:

providing a first logic function and a second logic function;

inserting don't care gates in the first and second logic functions in response to don't care conditions in the first and second logic functions to create a first circuit and a second circuit; and in response to the first and second circuits, performing a combinational equivalence check of the first circuit to the second circuit, wherein the combinational equivalence check includes applying 3-valued structural satisfiability and 3-valued binary decision diagrams to represent a function behavior and to check an equivalence if there are only 3-valued don't care gates in the first and second circuits.

* * * * *